(12) United States Patent
Bylsma et al.

(10) Patent No.: US 6,255,707 B1
(45) Date of Patent: Jul. 3, 2001

(54) SEMICONDUCTOR LASER RELIABILITY TEST STRUCTURE AND METHOD

(75) Inventors: Richard B. Bylsma, Allentown, PA (US); Gustav E. Derkits, Jr., New Providence, NJ (US); William R. Heffner, Sinking Spring, PA (US)

(73) Assignee: Lucent Technologies, Inc., Murray Hill, NJ (US)

( * ) Notice: Subject to any disclaimer, the term of this patent is extended or adjusted under 35 U.S.C. 154(b) by 0 days.

(21) Appl. No.: 09/138,527

(22) Filed: Aug. 24, 1998

(51) Int. Cl.[7] .................................................. H01L 27/14
(52) U.S. Cl. ............................................. 257/414; 257/48
(58) Field of Search ..................... 257/48, 414; 324/719, 324/537, 713, 715

(56) References Cited

U.S. PATENT DOCUMENTS

| | | |
|---|---|---|
| 5,057,441 | 10/1991 | Gutt et al. . |
| 5,239,270 * | 8/1993 | Desbiens ............................. 324/719 |
| 5,450,016 | 9/1995 | Masumori . |
| 5,486,772 | 1/1996 | Hshieh et al. . |
| 5,504,434 | 4/1996 | Schepis et al. . |
| 5,532,600 | 7/1996 | Hoshino . |
| 5,598,102 | 1/1997 | Smayling et al. . |
| 5,625,288 | 4/1997 | Snyder et al. . |
| 5,648,275 | 7/1997 | Smayling et al. . |

OTHER PUBLICATIONS

Lamela, H., et al. Semiconductor Lasers Numerical Modeling: Digital Laser Model (DLM), SPIE vol. 2399, pp. 265–273.

McDaniel, D.L., et al., Vertical Cavity Surface–Emitting Semiconductor Lasers With Injection Laser Pumping, SPIE vol. 1219 Laser–Diode Technology and Applicators II (1990), pp. 284–291.

Evans, G.A., et al., Surface–Emitting Semiconductor Lasers And Laser Arrays, Sadhana, vol. 17, Parts 3 & 4, Sep. 1992, pp. 355–371.

Lyk, Vu Van, et al., Voltage Saturation Across The Injection Contact In A Laser Diode And The Phenomenon Of Negative Photo–EMF, pp. 236–276.

* cited by examiner

Primary Examiner—Roy Potter
(74) Attorney, Agent, or Firm—Dickstein Shapiro Morin & Oshinsky, LLP

(57) ABSTRACT

The invention relates to semiconductor lasers and more particularly to structures which enable the semiconductor lasers to be tested for reliability. The invention further relates to methods for testing the reliability of semiconductor lasers in wafer or chip form. The invention also relates to methods for the fabrication of semiconductor lasers which includes the use of reliability tests in the fabrication process where the reliability tests includes measuring the voltage drop or drops across one or more levels of a laser structure during the passage of current through the structure.

34 Claims, 4 Drawing Sheets

SEMICONDUCTOR LASER RELIABILITY TEST STRUCTURE AND METHOD

BACKGROUND OF THE INVENTION

1. Field of the Invention

The present invention relates to semiconductor lasers having a greater degree of reliability and more particularly to structures that enable semiconductor lasers to be tested for reliability. The invention further relates to methods for testing the reliability of semiconductor lasers in wafer or chip form. The invention also relates to methods for the fabrication of semiconductor lasers which include the use of reliability tests in the fabrication process where the reliability tests include measuring the voltage drop or drops across one or more levels of a laser structure during the passage of current through the structure.

Semiconductor lasers are used in a variety of applications that require a high level of reliability in the devices under normal use for specified periods of time. Reliability is of a special concern when the lasers are used in communications systems which are difficult to repair or replace, such as undersea cable. The cost of ensuring reliability of the semiconductor laser is a substantial part of the final cost of a laser transmitter or pump module. Thus, if the reliability of a laser is assured on the basis of tests performed on individual lasers after the full fabrication of the semiconductor laser devices or other incorporation of the devices in modules or packages, the cost of reliability assurance will be excessive due to the cost of handling and testing individual devices as well as the loss of materials and labor invested in the fabrication of those semiconductor laser devices which ultimately fail. The present invention overcomes these drawbacks.

In optical semiconductor devices, excitation is introduced by electron (hole) injection to the conduction (valence) band through current biasing at the p-n junction. The voltage drop across a semiconductor junction (either a p-n junction or a Schottky Metal-Semiconductor junction) depends on the impurities present in the junction volume itself. Any impurity which tends to counteract the effect of the dopants or which provides current leakage paths will cause a deviation of the voltage across the junction from the value it would have in the absence of the impurity. Impurities which cause reliability problems tend to be those which diffuse rapidly and these impurities will cause the junction voltage to change with time when the material is stressed very hard by the passage of substantial current. In addition, morphological changes in either the metalsemiconductor interface or the p-n junctions of the semiconductor device under bias will also cause changes in the voltage which are accelerated by high currents.

The theory of semiconductor laser reliability has been developed over many years since the invention of the semiconductor laser. For most lasers, the most important aspect of reliability is the change in efficiency of the laser. The problem of reliability of semiconductor lasers have been discussed in many articles, such as, for example, Aoyagi et al., "Threshold Current Density Dependence on p-doping in AlGaInP Laser," SPIE Laser Diode Technology and Applications II, Vol. 1219 1990; Sakaki et al., "Doping Optimization in InGaAsP DH Lasers and Improved Characteristics in BH Lasers Grown by MOVPE," Journal of Crystal Growth, Vol. 93 pp. 838–843, 1988; Zemel and Gallant, "Carrier Lifetime in InP/InGaAs/Inp by Open-Circuit Voltage and Photoluminescence Decay," Journal of Applied Physics, Vol. 78 pg. 1094, 1995 and Ikegami et al., "Stress Test on 1.3 $\mu$m Buried-Heterostructure Laser Diode," Electronics Letters, Vol. 19 pg. 382, 1983, which are herein incorporated by reference.

While not wishing to be bound by theory, it is believed that changes in this performance indicator may be due to non-radiative recombination centers (NRRCs) in the active region. These NRRCs result in changes in light output at a constant current, an increase in the threshold current of the laser, or an increase in the current required to create a stated optical power at the output facet. Non-radiative recombination centers may be induced by a variety of original causes, including diffusion of impurities into the active layer from regions outside of the active layer during processing. Diffusion of these NRRCs may be assisted by electrical fields, currents or by the heat energy generated by current flow. Additionally, the NRRCs may be generated during manufacture by improper processing such as excess alloying of the metal contacts near the active region or by the incorporation of impurities such as copper which are known to act as NRRCs. In direct band-gap semiconductors, NRRCs occur mainly as a result of crystalline defects or impurities. Additionally, NRRCs occur due to spiking of metal through the layers of the laser. This spiking is known to cause laser degradation and failure.

Since voltage can be measured very accurately, changes in voltage the junctions of the semiconductor device during the passage of current can be detected even when the change is very small. Thus, it is an object of the present invention to measure the changes in the voltage drop between the metal and the cap layer. The voltage drop between these layers correlates to changes in threshold current, which is a standard indicator of device reliability. Further, changes in voltage drops may be greatly accelerated by the passage of high currents through the device structure and these changes may be used to predict laser reliability.

Because the present invention relies on principals of device physics which are well-known to those skilled in the art, it is possible to correlate the present invention tb the measurement of other voltage drops in the stack of layers making up the device, including the drop across the first heterojunction, the device p-n junction and the junctions between the laser layers and the blocking layer.

The economic impact of the wafer level reliability testing of the present invention can be estimated by considering that much of the cost of a packaged laser is in the testing of the laser. Further, threats to laser reliability are often associated with errors in wafer fabrication which can be eliminated by the present invention.

2. Description of the Related Art

The prior art includes descriptions of the causes of failure of reliability of semiconductor lasers and other semiconductor devices, and the use of wafer level testing as a part of the fabrication of integrated circuits, but no use of wafer level testing incorporating a voltage test point as part of the fabrication sequence of a laser and no description of laser structures incorporating voltage test points.

In the past, it has been the practice to provide a test structure on the edge of a wafer or substrate to measure changes in the electrical properties. However, due to the high levels of electrical noise present in many manufacturing processes, it was usually necessary to halt the process and remove the wafer or substrate from the process in order to make the measurement. Therefore the process was interrupted and throughput was diminished. Further, the accuracy of the measurement was compromised by the need to re-start the process.

Various methods for detecting defects in, and thus testing the future reliability of, thin film insulators in integrated circuits, particularly insulators in memory devices, such as EPROMs, EEPROMs, DRAMs, and other products with nonvolatile memory, have been discussed in the related arts. Unfortunately, existing wafer-level-reliability monitors of oxide breakdown voltage are not good predictors of laser reliability, and they are slow and destructive. Further, these methods have been limited to memory devices and not the semiconductor lasers of the present invention.

One type of reliability testing for memory cells is called "burn-in". In a burn-in test, the integrated circuit is subjected to elevated temperatures before performing functional tests on the integrated circuit. An integrated circuit undergoing a burn-in test is subjected to an elevated temperature for several hours. Because a large amount of time is required for a burn-in test, functional testing is usually performed before a burn-in test is performed. Later, burn-in tests and other tests for material defects are performed on samples in a group, or batch, of integrated circuits which have already undergone functional testing.

Another prior method for determining defects in a semiconductor is to perform scanning electron microscope ("SEM") views of the semiconductor surfaces. The SEM provides detailed information about the structure of the device, but requires the destructive slicing of the die to expose the cross sectional view. Additionally, a great deal of time is required to prepare and analyze the many SEM photographs needed to adequately represent an entire semiconductor.

Another testing method for integrated circuits is shown by Gutt et al., U.S. Pat. No. 5,057,441. Gutt et al. disclose a method for testing metal films by measuring $1/f$ noise. They disclose causing a direct current and an alternating current to flow in the test portion, the combined currents being of sufficient magnitude to stimulate $1/f^2$ noise in the test portion, determining the noise spectrum associated with the alternating current and comparing the slope and amplitude of the spectrum with predetermined values at one or more preselected frequencies.

The present invention overcomes the drawbacks of the prior art and provides a method for efficiently testing semiconductor lasers at the wafer fabrication level. By testing the lasers at the wafer fabrication level, it is possible to greatly reduce the processing and testing costs inherent in laser fabrication.

SUMMARY OF THE INVENTION

The present invention tests laser structures in which voltage drops across specific interfaces, or a set of interfaces, may be tested while current flows through the laser in a normal manner. The invention further relates to a method for fabricating semiconductor lasers which incorporates testing the semiconductor lasers for reliability by testing the voltage drops across the semiconductor laser and using the results as predictors of reliability.

Specifically, the invention relates to a method for manufacturing a semiconductor laser which includes the steps of providing one or more semiconductor substrates (here referred to as "wafers") to be processed, and processing them. During the processing, a test point is formed on each of at least some of the substrates. The method further includes the step of evaluating a film test portion on at least one of the substrates relative to predetermined standards. If the result of the evaluation so indicates, the method further includes adjusting one or more process parameters such that subsequently processed substrates include film test portions conforming to the predetermined standards. The evaluating step comprises providing a voltage across the semiconductor laser through the voltage test point, determining the voltage drop across the semiconductor laser and comparing the voltage drop with a predetermined voltage profile. The method optionally includes performing one or more additional steps toward formation of the semiconductor laser to fabricate the laser for a particular application.

The above and other advantages and features of the invention will be more clearly understood from the following detailed description which is provided in connection with the accompanying drawings.

DETAILED DESCRIPTION OF PREFERRED EMBODIMENTS

The present invention will now be described with relation to a homojunction semiconductor laser. It is understood that the invention has broader applicability and may be used in any semiconductor laser, such as a single heterostructure laser, a double heterostructure laser, a multiple heterostructure laser, a homostructure laser or the like. Similarly, the process described below is but one method of many that could be used according to the present invention.

The fundamental light producing mechanism in a semiconductor laser is the recombination of excess conduction band electrons and valence band holes. The semiconductor laser is formed of an active layer surrounded by two confinement layers. In a heterojunction semiconductor laser, one confinement layer is n doped and the other confinement layer is p doped. In the practice of the present invention, the active layer and the confinement layer may be comprised of any materials known to be used for semiconductor lasers. For example, the active layer may be, for example, AlGa, InAs, GaAs, InGaN, GaN, InGaAsP or any other materials which may form a semiconductor laser. The confinement layer may be formed, for example, of AlSb, GaSb, InP, AlGaAs, InGaAsP, InGaN, InGaAlN or the like. For example, the laser may include an active layer which includes GaAs that is sandwiched by two confinement layers having a lower index of refraction than the active layer, the upper confinement layer being p doped and the lower confinement layer being n doped.

The present invention includes adding at least one voltage test point to the semiconductor laser during the wafer level fabrication of the semiconductor laser. Accordingly, a laser structure is disclosed which includes at least one voltage test point in addition to the contact points necessary for the normal operation of the laser, together with a method for testing the reliability of the semiconductor laser by which the voltage drop between two points in the laser structure is measured while a high current is passed through the structure. Further, a method for fabrication of semiconductor lasers is disclosed in which the fabrication sequence incorporates the testing of voltage drops in lasers as a means of assuring reliability.

Figure 1:
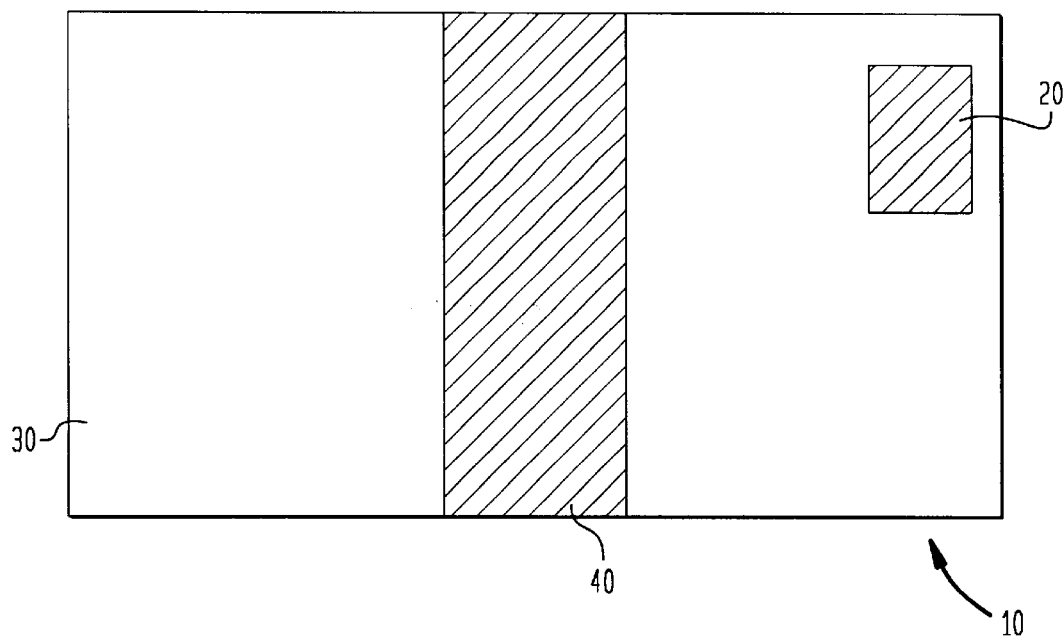
FIG. 1 shows a laser structure incorporating a test point attached to the cap layer of the laser.

Reference is now made to the figures. FIG. 1 shows a top view of a semiconductor laser structure 10 which has incorporated thereon a voltage test point 20. The voltage test point 20 is attached to a cap layer 30 of the semiconductor laser 10. While the figure shows only a single test point, it should be understood that the semiconductor laser wafer may include a plurality of voltage test points.

The semiconductor laser 10 further has an ohmic metal contact 40 which is connected to the cap layer 30. The ohmic metal contact is formed on an upper portion of the cap layer 30 and covers at least part of the cap layer 30. These contacts 20, 40 are added to the semiconductor laser during the fabrication of the semiconductor laser 10 at the wafer level. The contacts are physically and electrically in contact with the semiconductor laser 10 and are formed of any suitable conductive metal. It should be understood that the voltage test point 20 may be fabricated onto the surface of the semiconductor laser 10 by any methods known in the art for wafer fabrication.

Figure 2:
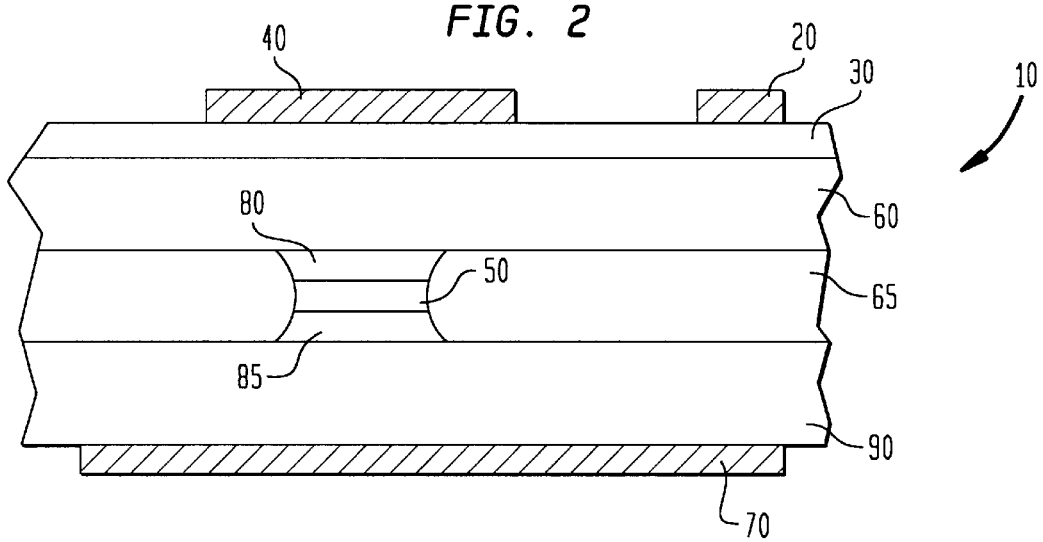
FIG. 2 shows a partially cut away side view of the structure of a typical laser during a step in the fabrication process having a voltage test point for evaluating reliability.

Reference is now made to FIG. 2. The figure shows a partially cut away side view of the structure of a typical semiconductor laser during fabrication having a voltage test point disposed thereon. The semiconductor laser 10 has an active region 50 displaced between an upper confinement region 80 and a lower confinement region 85. The upper confinement region 80 is formed of an p doped material and the lower confinement region 85 is formed of a n doped material. The active region 50, upper confinement region 80 and lower confinement region 85 are embedded in a blocking region 65 on a substrate 90. The semiconductor laser 10 has an n-side contact 70 which is physically and electrically in contact with the substrate 90. The semiconductor laser has a clad layer 60 displaced between the cap layer 30 and the blocking layer 65 and the upper confinement region 80. The semiconductor laser has a cap layer 30 patterned over the clad layer 60. The semiconductor laser 10 has a voltage test point 20 connected to a portion of the semiconductor laser 10. The semiconductor laser 10 also includes an ohmic contact 40 in physical and electrical contact with an upper portion of the semiconductor laser 10. The ohmic contact 40 and the voltage test point 20 are in electrical and physical contact with the semiconductor laser 10 through a cap layer 30.

Figure 3:
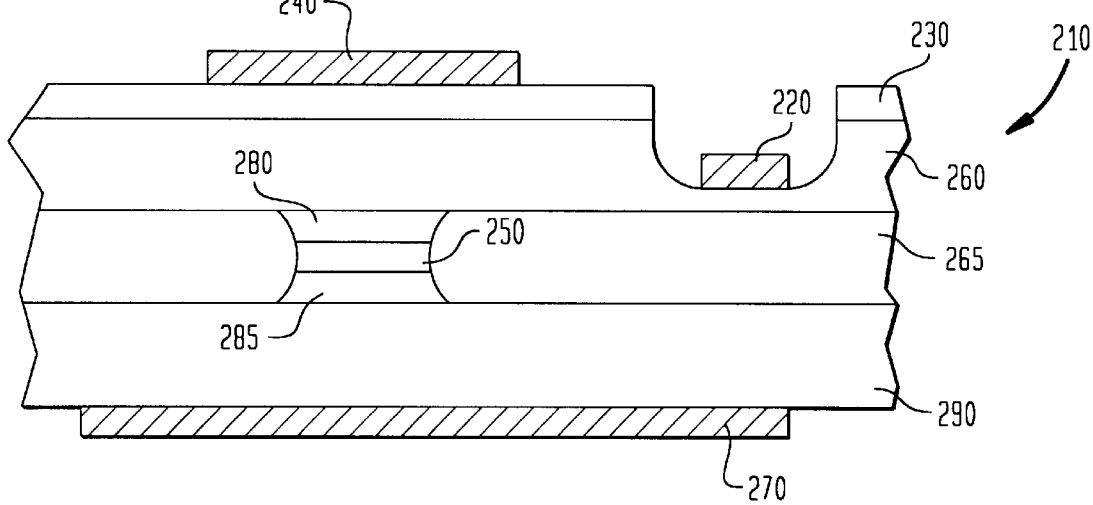
FIG. 3 shows a partially cut away side view of a structure of a typical laser during a step in the fabrication process having a voltage test point for evaluating reliability according to a second aspect of the invention.

Reference is now made to FIG. 3. The figure shows a partially cut away side view of a structure of a typical semiconductor laser during fabrication having a voltage test point 220 disposed on a clad layer 260 according to a second aspect of the invention. The semiconductor laser 210 has an active region 250 displaced between an upper confinement region 280 and a lower confinement region 285. The upper confinement region 280 is formed of an p doped material and the lower confinement region 285 is formed of a n doped material. The active region 250, upper confinement region 280 and lower confinement region 285 are embedded in a blocking region 265 on a substrate 290. The semiconductor laser 210 has an n-side contact 270 which is physically and electrically in contact with the substrate 290. The semiconductor laser has a clad layer 260 displaced between the cap layer 230 and the blocking layer 265 and the upper confinement region 280. The semiconductor laser has a cap layer 230 patterned over the clad layer 260. The semiconductor laser 210 has a voltage test point 220 connected to the upper portion of the clad layer 260. The semiconductor laser 210 also includes an ohmic contact 240 in physical and electrical contact with an upper portion of the semiconductor laser 210. The semiconductor laser 210 is then selectively cut away by one or more etching processes to remove a portion of the cap layer 220 to expose the clad layer 260. FIG. 3 shows that the clad layer 260 is also selectively etched to expose the clad layer 260 and permit placement of test point 220 at a location between upper and lower planar surfaces of clad layer 260; however, it is possible to only remove the cap layer 230 so as to expose the clad layer 260. The voltage test point 220 is then formed over the planar upper surface portion of the clad layer 260 so that the voltage loss between the metal layer 240 and the clad layer 260 can be measured as discussed below.

Figure 4:
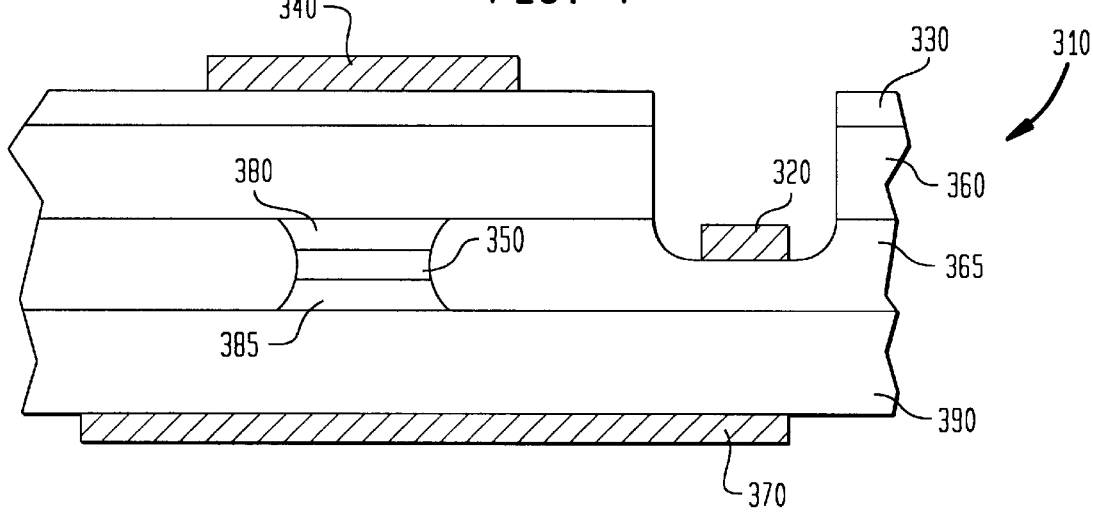
FIG. 4 shows a partially cut away side view of a structure of a typical laser during a step in the fabrication process having a voltage test point for evaluating reliability according to a third aspect of the invention.

Reference is now made to FIG. 4. The figure shows a partially cut away side view of a structure of a typical semiconductor laser during fabrication having a voltage test point 320 disposed on a blocking layer 365 according to a third aspect of the invention. The semiconductor laser 310 has an active region 350 displaced between an upper confinement region 380 and a lower confinement region 385. The upper confinement region 380 is formed of an p doped material and the lower confinement region 385 is formed of a n doped material. The active region 350, upper confinement region 380 and lower confinement region 385 are embedded in a blocking region 365 on a substrate 390. The semiconductor laser 310 has an n-side contact 370 which is physically and electrically in contact with the substrate 390. The semiconductor laser has a clad layer 360 displaced between the cap layer 330 and the blocking layer 365 and the upper confinement region 380. The semiconductor laser has a cap layer 330 patterned over the clad layer 360. The semiconductor laser 310 has a voltage test point 320 connected to an upper portion of the blocking layer 365. The semiconductor laser 310 also includes an ohmic contact 340 in physical and electrical contact with an upper portion of the semiconductor laser 310. The semiconductor laser 310 is then selectively cut away by one or more etching processes to remove a portion of the cap layer 320 and a portion of the clad layer 360 to expose the blocking layer 360. FIG. 4 shows that the blocking layer 365 is also selectively etched to a desired depth to expose the blocking layer 365; however, it is possible to only remove a portion of the cap layer 330 and a portion of the clad layer 360 so as to expose the blocking layer 365. The voltage test point 320 is then formed over a portion of the blocking layer 365 so that the voltage loss between the metal layer 340 and the blocking layer 365 can be measured as discussed below.

Figure 5:
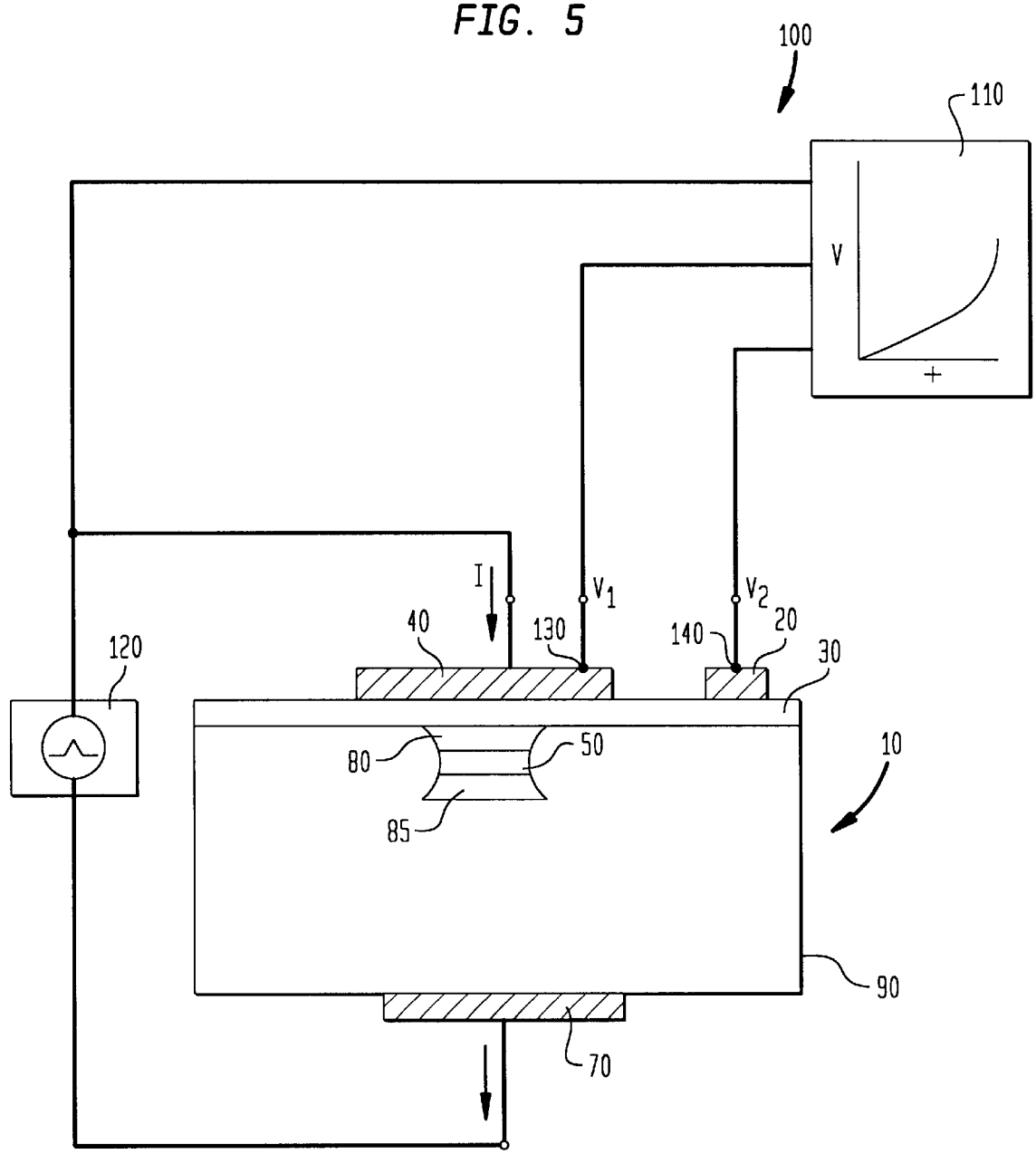
FIG. 5 shows an exemplary circuit by which the voltage drop between the contact metal and the cap layer may be measured in order to develop reliability-predictive information.

Reference is now made to FIG. 5. This figure shows an exemplary circuit by which the voltage drop in the semiconductor laser between the contact metal 40 and the cap layer 30 may be measured in order to develop reliability-predictive information. The circuit 100 includes a current source 120 which provides current across the semiconductor laser 10. The current across the semiconductor laser according to the present invention is that current used to operate semiconductor lasers in general. The selection of the current level will vary depending upon the type of semiconductor laser and materials that the semiconductor laser is formed from. Generally, the test current may range from between about 0.1 milliamp to about 1 amp. Preferably the current density equals or exceeds $1\times10^7$ amps/meter$^2$. The current I flows to the ohmic contact 40 which is located on the cap layer 30 of the semiconductor laser 10. Voltage drop, Vc, between the metal 40 and the cap layer 30 is between node 130 and node 140.

The current I flows from the current source 120 to the ohmic contact 40 and into the active layer 50 and the substrate 90. The current I flows through the substrate 90 and out the n-side contact 70. A separate contact, voltage test point 20, is provided on the cap layer 30. The voltage drop Vc between the metal 40 and the cap layer 30 can be monitored by a voltage measurement device 110 directly across the terminals 40, 20 of the semiconductor laser 10. The voltage measurement device 100 may include any well known voltage measuring device such as so-called multimeters, oscilloscopes or other devices.

The voltage drop Vc between the ohmic contact metal 40 and the cap layer 30 ($V_{2-V1}$) correlates to the changes in threshold current which is the standard indicator of semiconductor device reliability. Since voltage can be measured very accurately, changes in voltage across the junctions of the semiconductor device during the passage of current can be detected even when the change is very small. The smaller the voltage drop, the more reliable the semiconductor laser will be. The fact that the testing procedure takes place during the fabrication of the semiconductor laser allows for a determination of which semiconductor lasers have impurities in the NRRCs and should be discarded before further processing. Additionally, in situ testing of the semiconductor lasers during fabrication allows for modifications to the fabrication process if it is found that the impurities are due to a specific processing flaw.

Figure 6A:
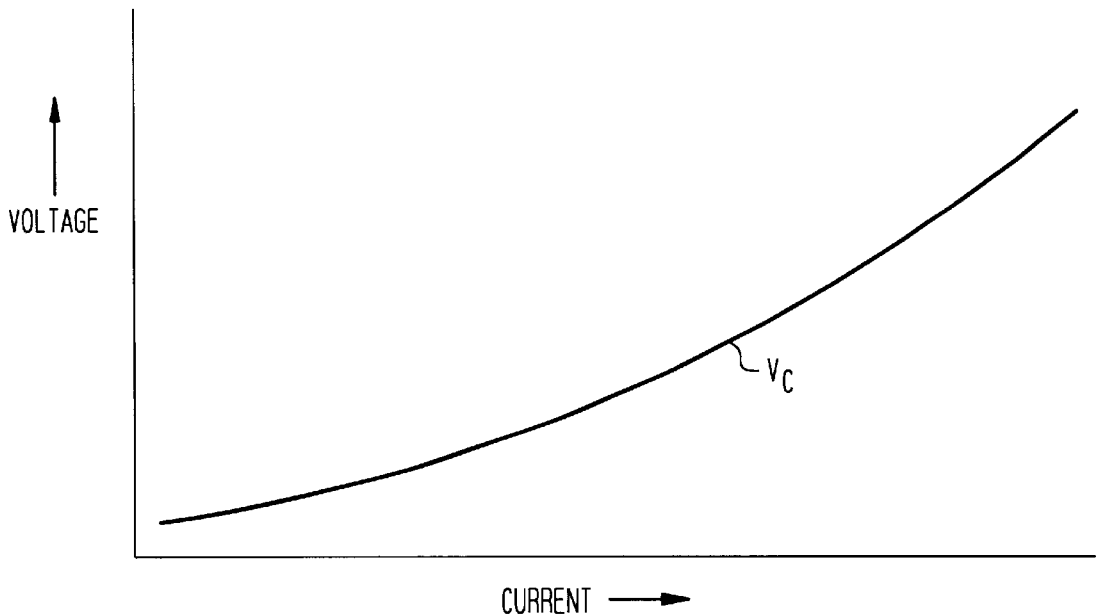
FIG. 6A shows current-voltage traces of a reliable laser during testing.
Figure 6B:
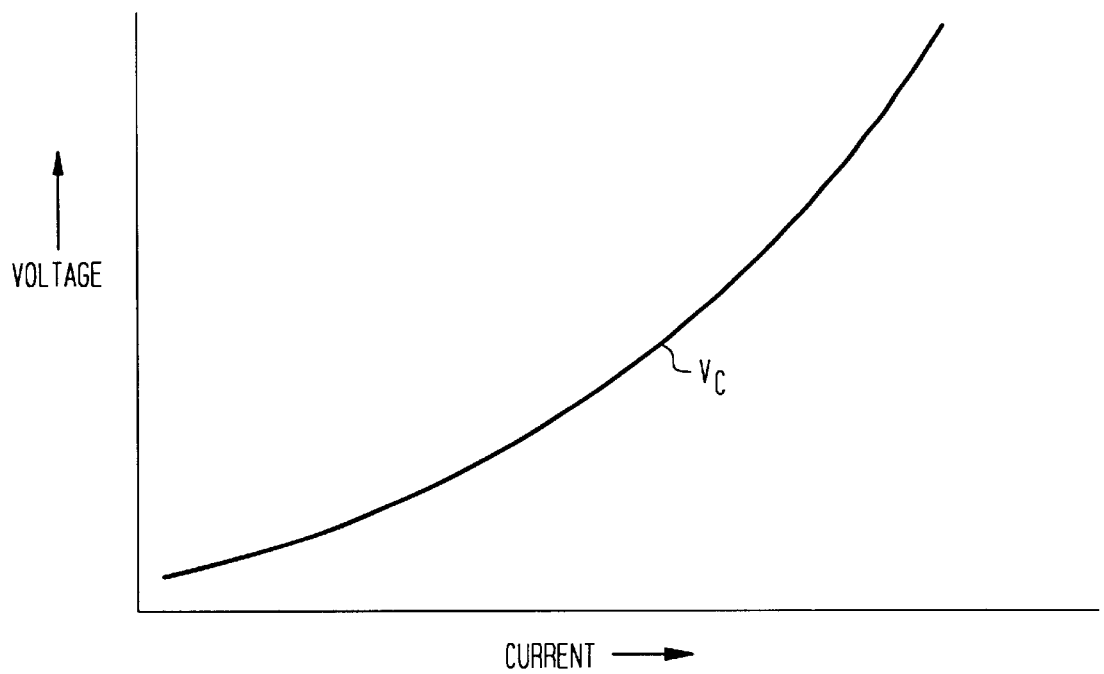
FIG. 6B shows current-voltage traces of an unreliable laser during testing.

Further, the present invention can be used to measure the change in voltage drop acceleration by increasing the current I from the current source 120. Reference is now made to FIG. 6. FIG. 6A shows current-voltage traces of a reliable laser during testing while FIG. 6B shows current-voltage traces of an unreliable laser during testing. Voltage is measured on the vertical axis and current is measured on the horizontal axis. As can be seen from FIG. 6A, as the current increases, the voltage drop between the ohmic contact 40 and the cap layer 30 increases. However, the ratio of the voltage drop Vc to the current is close to a linear relationship. The voltage/current profile in FIG. 6A indicates that the semiconductor laser was successfully fabricated as the resistance of the contact increases only slightly and the semiconductor laser should have good reliability during its use. FIG. 6B on the other hand, shows the results of a semiconductor laser which is unreliable. As can be seen from the figure, as the current increases, the voltage increases dramatically. The voltage/current profile of this test indicates that the resistance between the metal and the cap layer increases as the current is increased due to impurities during fabrication and that the laser is likely to fail during use.

Thus, the present invention provides a method and apparatus for testing semiconductor lasers for defects at the wafer or chip level during fabrication. It should again be noted that although the invention has been described with specific reference to homojunction semiconductor lasers, the invention has broader applicability and may be used in any semiconductor laser, such as a single heterostructure laser, a double heterostructure laser, or the like. Additionally, the semiconductor laser may also be coupled by a waveguide in an optoelectronic integrated circuit to additional circuitry, such as, for example additional lasers, photodetectors, modulators, semiconductor amplifiers, splitters, beam expanders or the like.

Similarly, the process described above is but one method of many that could be used. Accordingly, the above description and accompanying drawings are only illustrative of preferred embodiments which can achieve the features and advantages of the present invention. It is not intended that the invention be limited to the embodiments shown and described in detail herein. The invention is only limited by the scope of the following claims.

What is claimed as new and desired to be protected by Letters Patent of the United States is:

1. A semiconductor laser structure comprising:
    a semiconductor substrate having at least one area therein which produces light in response to an electrical signal;
    a cap layer;
    a metal layer; and
    at least one voltage test point affixed to said cap layer to measure a voltage drop between said metal layer and said cap layer.

2. The semiconductor laser structure according to claim 1, wherein said semiconductor laser structure is a homojunction laser.

3. The semiconductor laser structure according to claim 1, wherein said semiconductor laser is a heterojunction laser.

4. The semiconductor laser structure according to claim 1, wherein said semiconductor laser structure includes one voltage test point.

5. The semiconductor laser structure according to claim 1, wherein said voltage test point is formed on the semiconductor laser during fabrication of said semiconductor laser.

6. The semiconductor laser structure according to claim 1, wherein said semiconductor laser includes an active layer comprising InGaAsP that is sandwiched by two confinement layers having a lower index of refraction than said active layer.

7. The semiconductor laser structure according to claim 1, wherein said semiconductor laser includes an active layer comprising InGaN that is sandwiched by two confinement layers having a lower index of refraction than said active layer.

8. The semiconductor laser structure according to claim 1, wherein said voltage test point is affixed to an upper planar surface of said cap layer.

9. The semiconductor laser structure according to claim 1, wherein said voltage test point is affixed to an etched portion of said cap layer.

10. An laser apparatus comprising:
    a semiconductor laser including a semiconductor substrate having at least one area therein which produces light in response to an electrical signal;
    a cap layer formed on an upper surface of said semiconductor substrate;
    a metal layer formed over at least a part of said cap layer;
    and at least one voltage test point affixed to said cap layer to measure a voltage drop between said metal layer and said cap layer; and
    a source to provide an electrical signal to said semiconductor laser.

11. The laser apparatus according to claim 10, wherein said semiconductor laser is a homojunction laser.

12. The laser apparatus according to claim 10, wherein said semiconductor laser includes an active layer comprising InGaAsP that is sandwiched by two confinement layers having a lower index of refraction than said active layer.

13. The laser apparatus according to claim 10, wherein said semiconductor laser includes an active layer comprising InGaN that is sandwiched by two confinement layers having a lower index of refraction than said active layer.

14. The laser apparatus according to claim 10, wherein said voltage test point is affixed to an upper planar surface of said cap layer.

15. The laser apparatus according to claim 10, wherein said voltage test point is affixed to an etched portion of said cap layer.

16. A semiconductor laser structure comprising:
   a semiconductor substrate having doped areas, said doped areas including an active area, which produces light in response to an electrical signal, sandwiched by confinement layers;
   a cap layer formed on an upper portion of said semiconductor substrate;
   a metal layer formed over at least a part of said cap layer;
   at least one voltage test point affixed to said semiconductor laser to measure a voltage drop between said metal layer and said voltage test point; and
   a lower side contact formed on a lower portion of said semiconductor substrate.

17. The semiconductor laser structure according to claim 16, wherein current flows through said semiconductor laser from said metal layer to said lower side contact.

18. The semiconductor laser structure according to claim 16, wherein said voltage drop between said metal layer and said cap layer is determined by affixing said voltage test point to said cap layer and measuring a voltage drop between said voltage test point and said metal layer.

19. The semiconductor laser structure according to claim 16, further comprising a clad layer under said cap layer and wherein the voltage drop between said metal layer and said clad layer is determined by affixing said voltage test point to said clad layer and measuring a voltage drop between said voltage test point and said metal layer.

20. The semiconductor laser structure according to claim 16, further comprising a clad layer under said cap layer and a blocking layer under said clad layer, wherein the voltage drop between said metal layer and said blocking layer is determined by affixing said voltage test point to said blocking layer and measuring a voltage drop between said voltage test point and said metal layer.

21. A semiconductor laser structure comprising:
   a semiconductor substrate having at least one area therein which produce light in response to an electrical signal;
   a clad layer;
   a cap layer formed over at least a portion of said clad layer;
   a metal layer formed over at least a portion of said cap layer and
   at least one voltage test point affixed to said clad layer to measure a voltage drop between said metal layer and said clad layer.

22. The semiconductor laser structure according to claim 21, wherein said semiconductor laser structure is a homojunction laser.

23. The semiconductor laser structure according to claim 21, wherein said semiconductor is a heterojunction laser.

24. The semiconductor laser structure according to claim 21, wherein said semiconductor laser includes one voltage test point.

25. The semiconductor laser structure according to claim 21, wherein said voltage test point is formed on the semiconductor laser during fabrication of said semiconductor laser.

26. The semiconductor laser structure according to claim 21, wherein said voltage test point is affixed to an upper planar surface of said clad layer.

27. The semiconductor laser structure according to claim 21, wherein said voltage test point is affixed to an etched portion of said clad layer.

28. A semiconductor laser structure comprising:
   a semiconductor substrate having at least one area therein which produces light in response to an electrical signal;
   a blocking layer formed in said substrate
   a clad layer formed on at least a portion of said blocking layer;
   a cap layer formed on at least a portion of said clad layer;
   a metal layer formed on at least a portion of said cap layer and
   at least one voltage test point affixed to said blocking layer to measure a voltage drop between said metal layer and said blocking layer.

29. The semiconductor laser structure according to claim 28 wherein said semiconductor laser is a homojunction laser.

30. The semiconductor laser structure according to claim 28, wherein said semiconductor laser is a heterojunction laser.

31. The semiconductor laser structure according to claim 28, wherein said semiconductor laser includes one voltage test point.

32. The semiconductor laser structure according to claim 28, wherein said voltage test point is formed on the semiconductor laser during fabrication of said semiconductor laser.

33. The semiconductor laser structure according to claim 28, wherein said voltage test point is affixed to an upper planar surface of said blocking layer.

34. The semiconductor laser structure according to claim 28, wherein said voltage test point is affixed to an etched portion of said clad layer.

* * * * *